(12) United States Patent
Suzuki et al.

(10) Patent No.: US 8,350,350 B2
(45) Date of Patent: Jan. 8, 2013

(54) OPTICAL SENSOR

(75) Inventors: Jun Suzuki, Hamamatsu (JP);
Fumikazu Ojima, Hamamatsu (JP);
Ryusuke Kitaura, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 34 days.

(21) Appl. No.: 13/139,599

(22) PCT Filed: Dec. 22, 2009

(86) PCT No.: PCT/JP2009/071316
§ 371 (c)(1),
(2), (4) Date: Jun. 14, 2011

(87) PCT Pub. No.: WO2010/079686
PCT Pub. Date: Jul. 15, 2010

(65) Prior Publication Data
US 2011/0241154 A1 Oct. 6, 2011

(30) Foreign Application Priority Data
Jan. 6, 2009 (JP) ................................ 2009-000926

(51) Int. Cl.
*H01L 31/024* (2006.01)
(52) U.S. Cl. ............... 257/437; 257/E31.131; 250/338.1
(58) Field of Classification Search .................. 257/467, 257/E31.131; 250/338.1, 338.4
See application file for complete search history.

(56) References Cited

U.S. PATENT DOCUMENTS 6,034,374 A * 3/2000 Kimura et al. ........... 250/370.08
6,242,738 B1 6/2001 Ju
2009/0121137 A1* 5/2009 Liddiard ................... 250/338.1
2010/0084556 A1* 4/2010 Oh et al. ................... 250/338.4
2012/0097853 A1* 4/2012 Ouvrier-Buffet et al. .... 250/349

FOREIGN PATENT DOCUMENTS

| JP | 4-274346 | 9/1992 |
|---|---|---|
| JP | 10-185681 | 7/1998 |
| JP | 10-209418 | 8/1998 |
| JP | 10-227689 | 8/1998 |
| JP | 2001-099705 | 4/2001 |
| JP | 2002-533668 | 10/2002 |
| JP | 2005-043381 | 2/2005 |
| JP | 2008-022315 | 1/2008 |
| WO | 2009/116496 | 9/2009 |

* cited by examiner

*Primary Examiner* — Colleen Matthews
(74) *Attorney, Agent, or Firm* — Drinker Biddle & Reath LLP

(57) ABSTRACT

In an infrared sensor (1) having a bolometer element (11) and a reference element (21), the reference element (21) comprises a bolometer film (22), a substrate-side insulating film (31) formed on the substrate-side surface of the bolometer film (22), a heat dissipation film (23) made of amorphous silicon formed on the substrate-side surface of the bolometer film (22) with the substrate-side insulating film (31) interposed therebetween, and a plurality of heat dissipation columns (25) made of amorphous silicon thermally connected to the heat dissipation film (23) and a substrate (10), while the bolometer film (22) and substrate-side insulating film (31) are formed such as to extend over a side face of the heat dissipation film (23) intersecting a surface of the substrate (10). Thus configured infrared sensor (1) can efficiently reduce the influence of temperature changes in the environment in use, while being made smaller.

6 Claims, 19 Drawing Sheets

OPTICAL SENSOR

TECHNICAL FIELD

The present invention relates to an optical sensor.

BACKGROUND ART

As an optical sensor, a bolometer type infrared sensor for detecting infrared rays has conventionally been known. The bolometer type infrared sensor is an optical sensor which detects infrared rays by using a material whose resistance value changes depending on temperature and disclosed in Patent Literature 1, for example. Patent Literature 1 discloses a bolometer type infrared sensor comprising a bolometer element for sensing an infrared ray incident thereon and a reference element for detecting a temperature change caused by a change in an environment in use. By using a signal issued from the bolometer element and a signal issued from the reference element, the bolometer type infrared sensor computes a signal which is free from the influence of the temperature change generated by the change in the environment in use, thereby detecting the infrared ray.

CITATION LIST

Patent Literature

Patent Literature 1: Japanese Patent Application Laid-Open No. 10-227689

SUMMARY OF INVENTION

Technical Problem

In the infrared sensor disclosed in Patent Literature 1, the bolometer element has a bolometer thin film supported on a silicon substrate through a void, and the reference element has a bolometer thin film formed on the silicon substrate with a sacrificial layer interposed therebetween.

However, the infrared sensor disclosed in Patent Literature 1 employs a material having a low coefficient of thermal conductivity and a high heat capacity for the sacrificial layer of the reference element, whereby the influence of the temperature change in the environment in use may not fully be reduced.

On the other hand, there has been an idea of making the sacrificial layer thinner in the reference element in order to improve the response to the temperature change in the environment in use.

Making the sacrificial layer thinner, however, changes the height of the reference element, thereby increasing the difference in height between the bolometer element and reference element. This makes it difficult for the focal depth to be regulated upon patterning by exposure to light, for example, whereby fine patterns are harder to form, which may hinder the infrared sensor from being made smaller.

For solving the problems mentioned above, it is an object of the present invention to provide an optical sensor which can fully reduce the influence of the temperature change in the environment in use, while being made smaller.

Solution to Problem

For solving the above-mentioned problems, the present invention provides an optical sensor comprising a first bolometer film supported on a surface of a substrate while being separated from the surface of the substrate, a second bolometer film supported on the surface of the substrate while being separated from the surface of the substrate, a substrate-side insulating film formed on a substrate-side surface of the second bolometer film, a heat dissipation film made of amorphous silicon formed on the substrate-side surface of the second bolometer film with the substrate-side insulating film interposed therebetween, and a plurality of heat dissipation columns made of amorphous silicon thermally connected to the heat dissipation film and substrate, wherein the second bolometer film and substrate-side insulating film are formed such as to extend over a side face of the heat dissipation film intersecting the surface of the substrate.

In this optical sensor, the second bolometer film is connected to the substrate through the heat dissipation film and heat dissipation columns. Therefore, when the second bolometer film is employed as a bolometer film of a reference element, the heat generated in the second bolometer film by an infrared ray is transmitted to the substrate through the substrate-side insulating film, heat dissipation film, and heat dissipation columns. Since the second bolometer film and substrate-side insulating film are formed such as to extend over a side face of the heat dissipation film, the contact area of the second bolometer film and substrate-side insulating film with the heat dissipation film increases, thereby widening paths through which heat is transmitted from the second bolometer film to the heat dissipation film. Therefore, the heat generated in the second bolometer film is efficiently transmitted to the substrate, whereby temperature changes generated by changes in the environment in use can be measured alone accurately. As a result, the influence of temperature changes in the environment in use can be reduced efficiently. Further, since it is unnecessary for sacrificial layers to be made thinner in order to dissipate the heat of the reference element efficiently into the substrate, the focal depth can be controlled easily upon patterning by exposure to light, for example, so that fine patterns can be formed easily, whereby the size can be reduced.

Preferably, in the optical sensor, a metal film is formed in a region opposing the second bolometer film in the surface of the substrate, while the plurality of heat dissipation columns are thermally connected to the substrate through the metal film.

In this case, since the metal film is interposed between the heat dissipation columns and substrate, the thermal contact area between the heat dissipation columns and substrate can be increased when the second bolometer film is employed as a bolometer film of a reference element. As a consequence, the heat generated in the second bolometer film by the infrared ray incident thereon can be transmitted to the substrate more efficiently.

Preferably, in the optical sensor, a reflective film made of a metal is formed in a region opposing the first bolometer film in the surface of the substrate.

In this case, when employing the first bolometer film as a bolometer film of a bolometer element, an infrared ray transmitted through the first bolometer film can be reflected by the reflective film to the first bolometer film side so as to be made incident on the first bolometer film again. Therefore, the heat generated by the infrared ray can be measured efficiently.

Preferably, in any of the optical sensors mentioned above, the first and second bolometer films are arranged substantially parallel to the surface of the substrate and formed at substantially the same height from the substrate. Such a structure makes it further easier to control the focal depth upon patterning by exposure to light, for example.

Preferably, in any of the optical sensors mentioned above, the amorphous silicon constituting the heat dissipation film and the plurality of heat dissipation columns is doped with a metal element. This is because the coefficient of thermal conductivity can be raised thereby. Preferably, the substrate-side insulating film is formed by an insulating material containing silicon.

Advantageous Effects of Invention

As in the foregoing, the present invention can make an optical sensor smaller while efficiently reducing the influence of temperature changes in the environment in use.

DESCRIPTION OF EMBODIMENTS

In the following, embodiments of the present invention will be explained in detail with reference to the drawings. In the explanation of the drawings, the same constituents will be referred to with the same signs, while omitting their overlapping descriptions.

Figure 1:
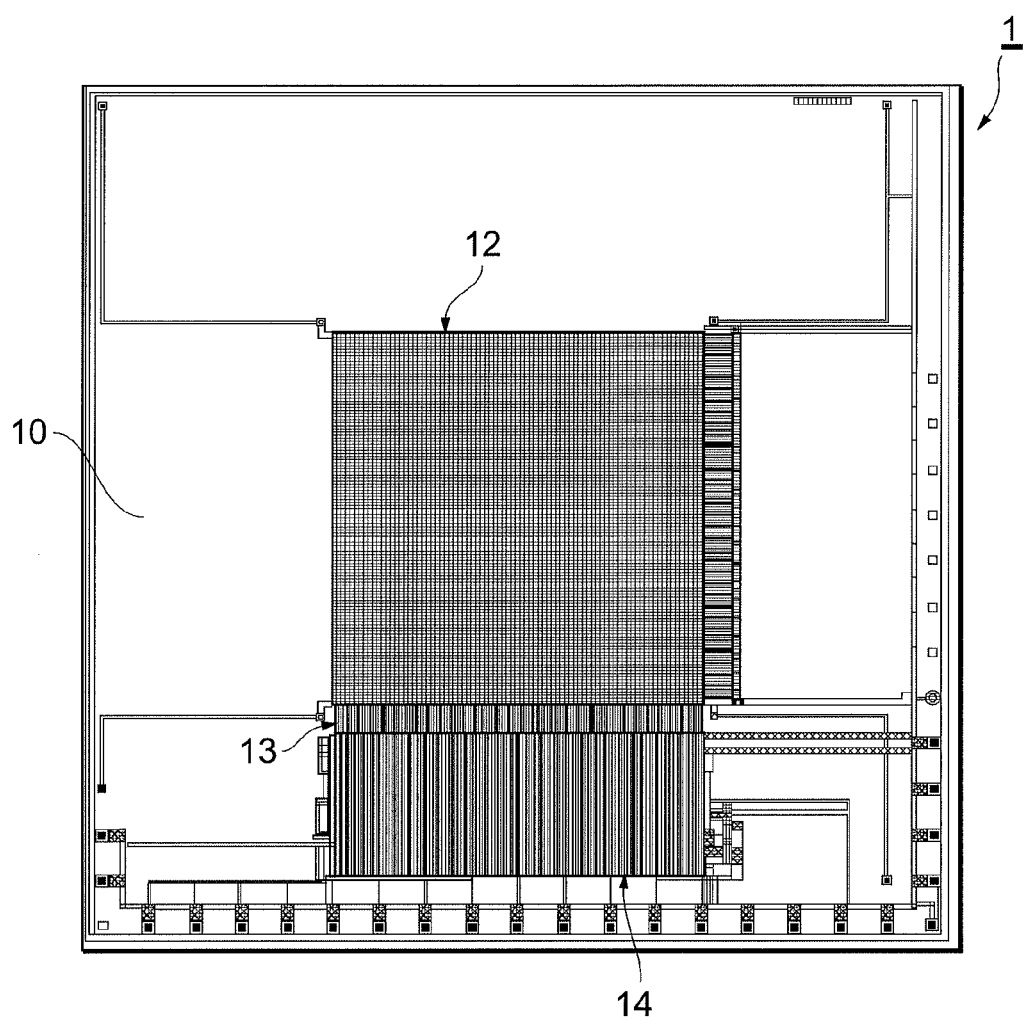
FIG. 1 is a plan view illustrating the structure of an infrared sensor which is an embodiment of the optical sensor in accordance with the present invention.
Figure 2:
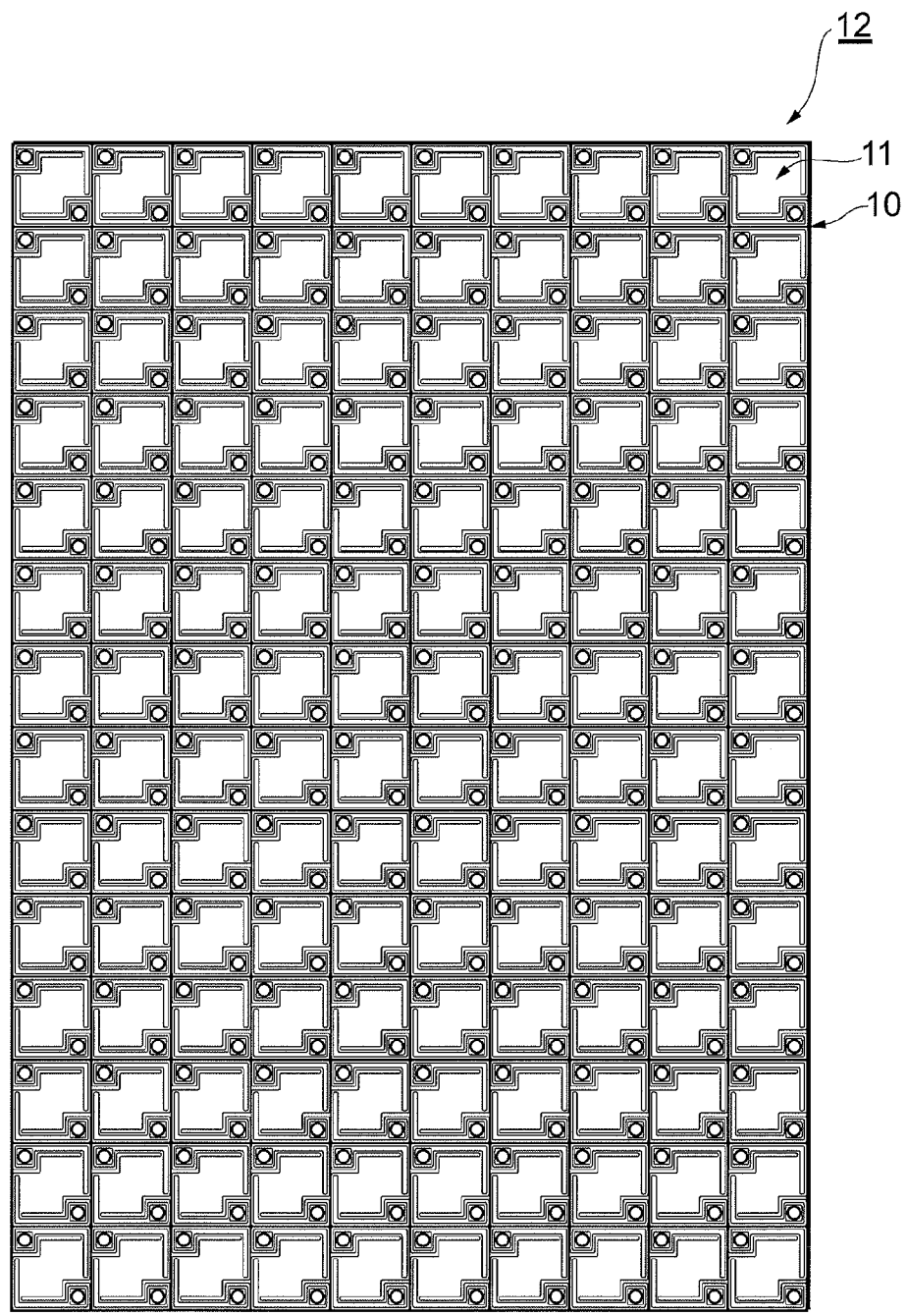
FIG. 2 is a partly enlarged plan view of a pixel unit of the infrared sensor in FIG. 1.
Figure 3:
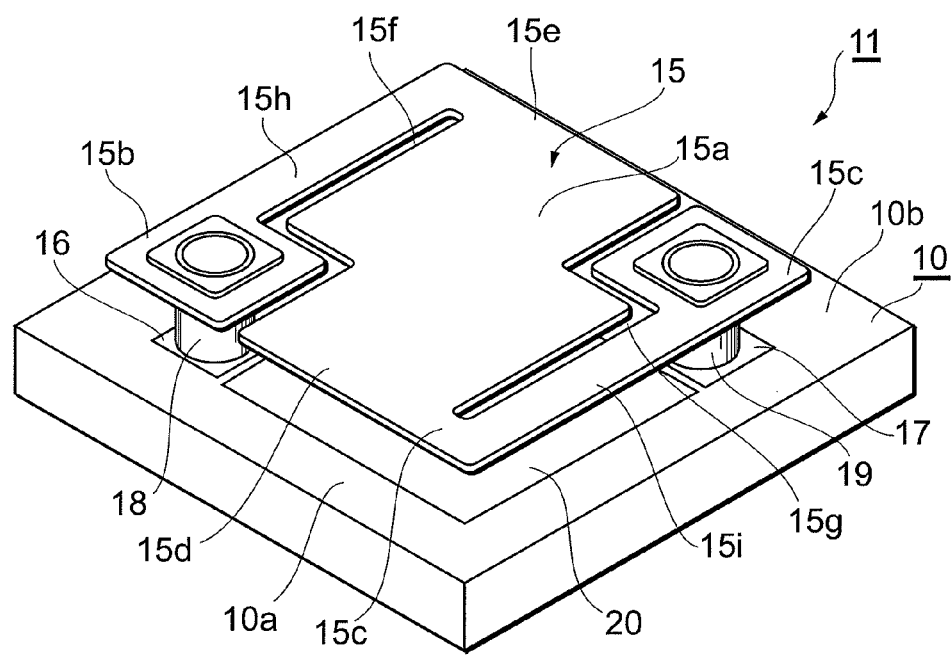
FIG. 3 is a perspective view of a bolometer element in the pixel unit of the infrared sensor in FIG. 1.
Figure 4:
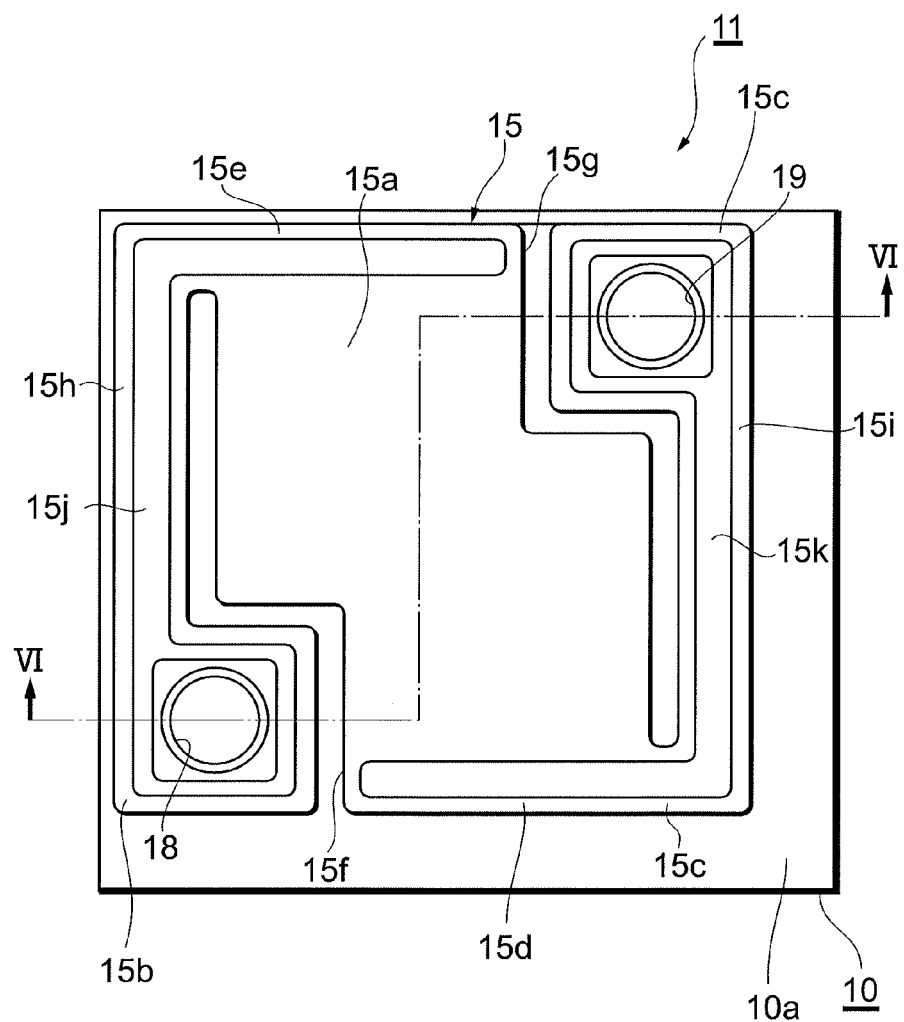
FIG. 4 is a plan view of the bolometer element in the pixel unit of the infrared sensor in FIG. 1.
Figure 5:
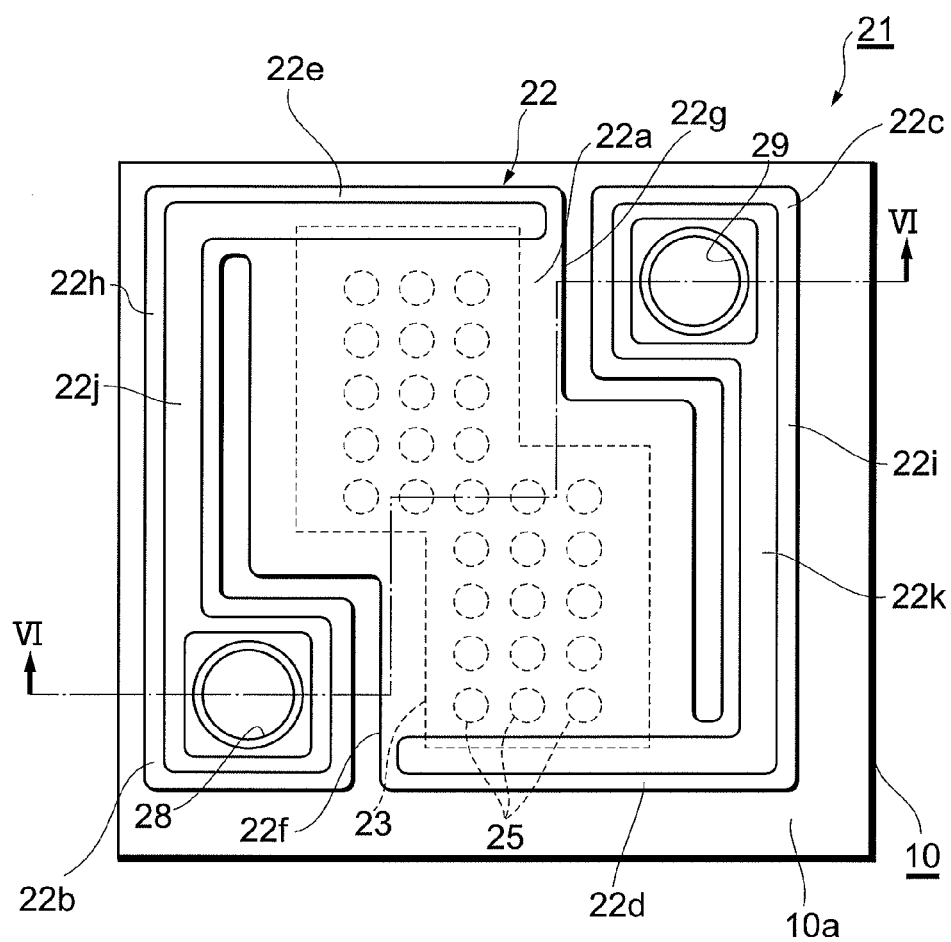
FIG. 5 is a plan view of a reference element in a reference pixel unit of the infrared sensor in FIG. 1.
Figure 6:
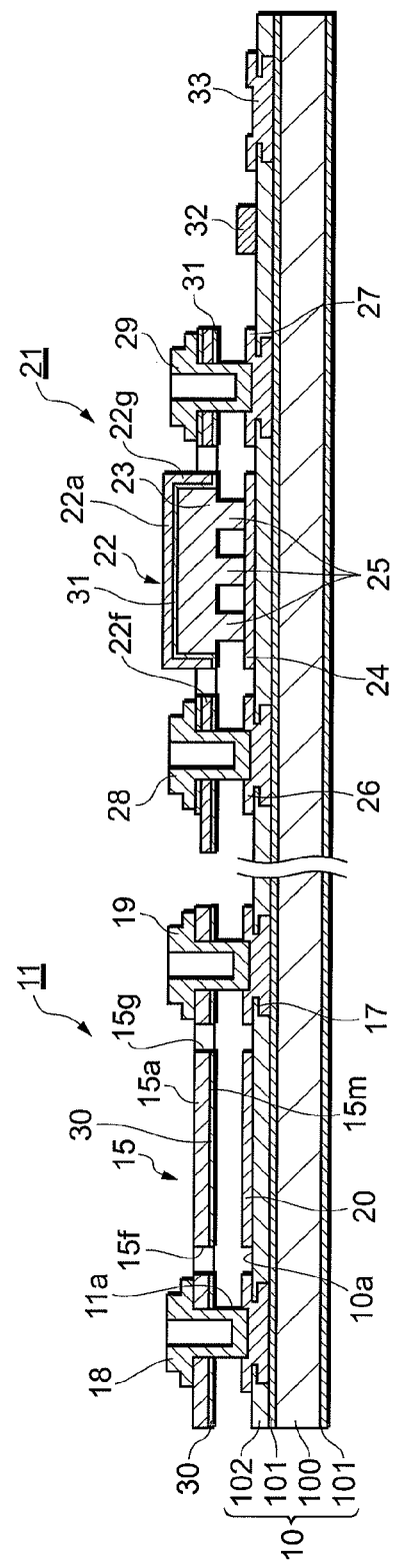
FIG. 6 is a combined sectional view taken along the line VI-VI of FIGS. 4 and 5.

The optical sensor in accordance with an embodiment of the present invention is a so-called bolometer type infrared sensor which detects infrared rays by using a material whose resistance value changes depending on temperature and favorably used for infrared imagers, thermography, and the like. Here, FIG. 1 is a plan view of the infrared sensor in accordance with the embodiment of the present invention, FIG. 2 is a plan view enlarging a part of a pixel unit in the infrared sensor of FIG. 1, and FIG. 3 is a perspective view illustrating the structure of one pixel in the infrared sensor of FIG. 1. FIG. 4 is a plan view illustrating the structure of one pixel in the pixel unit in the infrared sensor of FIG. 1, FIG. 5 is a plan view illustrating the structure of one pixel in a reference pixel unit in the infrared sensor of FIG. 1, and FIG. 6 is a schematic sectional view of the infrared sensor combining a cross section taken along the line VI-VI of FIG. 4 and a cross section taken along the line VI-VI of FIG. 5.

As illustrated in FIG. 1, an infrared sensor 1 is a sensor for detecting an infrared ray according to a thermal change and has a substrate 10 and a pixel unit 12, a reference pixel unit 13, and a signal processing circuit unit 14 which are formed on the substrate 10.

The substrate 10 is a planar member with fixed width, depth, and thickness, for which an Si (silicon) substrate is used, for example. While thermally oxidized layers and foundation layers may be formed on the surface of the Si substrate, the substrate 10 means the Si substrate including these layers, if any, formed therewith in this embodiment.

The pixel unit 12 functions as an infrared receiving device and is electrically connected to the signal processing circuit unit 14. As illustrated in FIG. 2, the pixel unit 12 has a two-dimensional array structure in which a plurality of pixels (bolometer elements 11) are arranged in a regular two-dimensional matrix on the substrate 10 and serves as a so-called surface micromachine.

As illustrated in FIGS. 3 and 4, the bolometer element 11 constituting each pixel is formed in a rectangular pixel region 10b on a surface 10a of the substrate 10. The bolometer element 11 has ROIC (Readout Integrated Circuit) pads 16, 17, electrode plugs 18, 19, and a bolometer thin film (first bolometer film) 15.

The ROIC pads 16, 17 are electrically conductive rectangular pads. The ROIC pads 16, 17 are disposed at positions (diagonal positions) diagonally opposing each other across the center of the pixel region 10b and electrically connected to the signal processing circuit unit 14, which is not depicted in FIGS. 3 and 4.

The electrode plugs 18, 19 are formed on the ROIC pads 16, 17, respectively. Each of the electrode plugs 18, 19 is a mainly circular columnar member erected in a direction intersecting the surface 10a, while its portion slightly higher than the midpoint in the height direction is connected to the bolometer thin film 15. The electrode plugs 18, 19 are made of an electrically conductive material, for which Al (aluminum) is used, for example.

The bolometer thin film 15 is a mainly rectangular thin film and disposed substantially in parallel with the substrate 10 while being separated from the surface 10a. In the bolometer thin film 15, the center part is a light-receiving part 15a for receiving infrared rays, while two corner parts 15b, 15c disposed at diagonal positions are connected to the electrode plugs 18, 19, respectively. The bolometer thin film 15 is formed with crank-shaped slits 15f, 15g which extend from two peripheral parts 15d, 15e opposing each other and constituting the light-receiving part 15a, so as to leave the corner parts 15b, 15c. Parts joined to the corner parts 15b, 15c on the outer side of the slits 15f, 15g form beam parts 15h, 15i.

The beam parts 15h, 15i are formed such as to extend from the corner parts 15b, 15c along the outer periphery of the light-receiving part 15a and oppose each other. The light-receiving part 15a and the beam parts 15h, 15i are spatially separated from each other by the slits 15f, 15g and thus are thermally separated from each other. Employed for the bolometer thin film 15 is a material whose resistivity varies greatly as temperature changes, an example of which is amorphous silicon.

The beam parts 15h, 15i are formed with leads 15j, 15k (not depicted in FIG. 3). The leads 15j, 15k are electrically connected to the electrode plugs 18, 19, respectively, on one end side and to the light-receiving part 15a on the other end side. Hence, the leads 15j, 15k are electrically connected to the signal processing circuit unit 14 through the electrode plugs 18, 19 and ROIC pads 16, 17.

As illustrated in FIG. 3, the bolometer thin film 15 is supported on the substrate 10 such that only the corner parts 15b, 15c are connected to the electrode plugs 18, 19 while the other part is separated from the surface 10a. This forms a void 11a between the bolometer thin film 15 and substrate 10 as illustrated in FIG. 6.

Further, as illustrated in FIG. 6, an insulating film 30 is formed on the surface 15m of the bolometer thin film 15 on the substrate 10 side. For example, an oxidized silicon film (silicon oxide), which may be silicon nitride as well, formed by a plasma CVD (Chemical Vapor Deposition) method using TEOS (tetraethyl orthosilicate) as a material is used for the insulating film 30. A reflective film 20 made of a metal is laminated on the surface 10a in a region opposing the bolometer thin film 15. A metal exhibiting a high reflectance to infrared rays is used for the reflective film 20.

As in the foregoing, the bolometer element 11 has a membrane structure in which the bolometer thin film 15 is disposed substantially in parallel with the substrate 10 while being separated from the surface 10a of the substrate 10. The bolometer thin film 15 and substrate 10 are spatially and thermally separated from each other by the void 11a. Changes in resistivity caused by changes in the temperature of the light-receiving part 15a of the bolometer thin film 15 can be read by the signal processing circuit unit 14 through the leads 15j, 15k, electrode plugs 18, 19, and ROIC pads 16, 17.

On the other hand, the reference pixel unit 13 has a two-dimensional array structure in which a plurality of pixels (reference elements 21) are arranged in a regular two-dimensional matrix on the substrate 10. Each pixel is so-called optical black. The reference element 21 constituting each pixel has substantially the same structure as that of the bolometer element 11 as illustrated in FIGS. 5 and 6. The reference element 21 differs from the bolometer element 11 in that it has a bolometer thin film (second bolometer thin film) 22, a heat dissipation film 23, a heat dissipation metal film 24, a plurality of heat dissipation columns 25, and a substrate-side insulating film 31. The reference element 21 also has ROIC pads 26, 27 and electrode plugs 28, 29 (not depicted in FIG. 5), which are constructed as in the bolometer element 11 and thus will not be explained in detail.

The bolometer thin film (second bolometer thin film) 22 is disposed such as to be substantially in parallel with the surface 10a of the substrate 10 and form substantially the same plane with the bolometer thin film 15. Here, forming substantially the same plane means that the difference in height from the surface 10a between the bolometer thin films 22, 15 falls within a thickness range of the heat dissipation film 23 which will be explained later, i.e., the gap between a plane including the bolometer thin film 22 and a plane including the bolometer thin film 15 falls within about ±1 μm as seen from the surface 10a, for example, so that the bolometer thin films 22, 15 are formed at substantially the same height from the substrate 10.

The bolometer thin film 22 is a mainly rectangular thin film similar to the bolometer thin film 15 and has a light-receiving part 22a, corner parts 22b, 22c, peripheral parts 22d, 22e, slits 22f, 22g, beam parts 22h, 22i, and leads 22j, 22k as well as an extension part 22s which will be explained later.

The substrate-side insulating film 31 is formed on the surface of the light-receiving part 22a on the substrate 10 side in the bolometer thin film 22, and the heat dissipation film 23 is formed on the substrate-side insulating film 31. The substrate-side insulating film 31 is constituted by a material similar to that of the insulating film 30 of the bolometer element 11.

Figure 19:
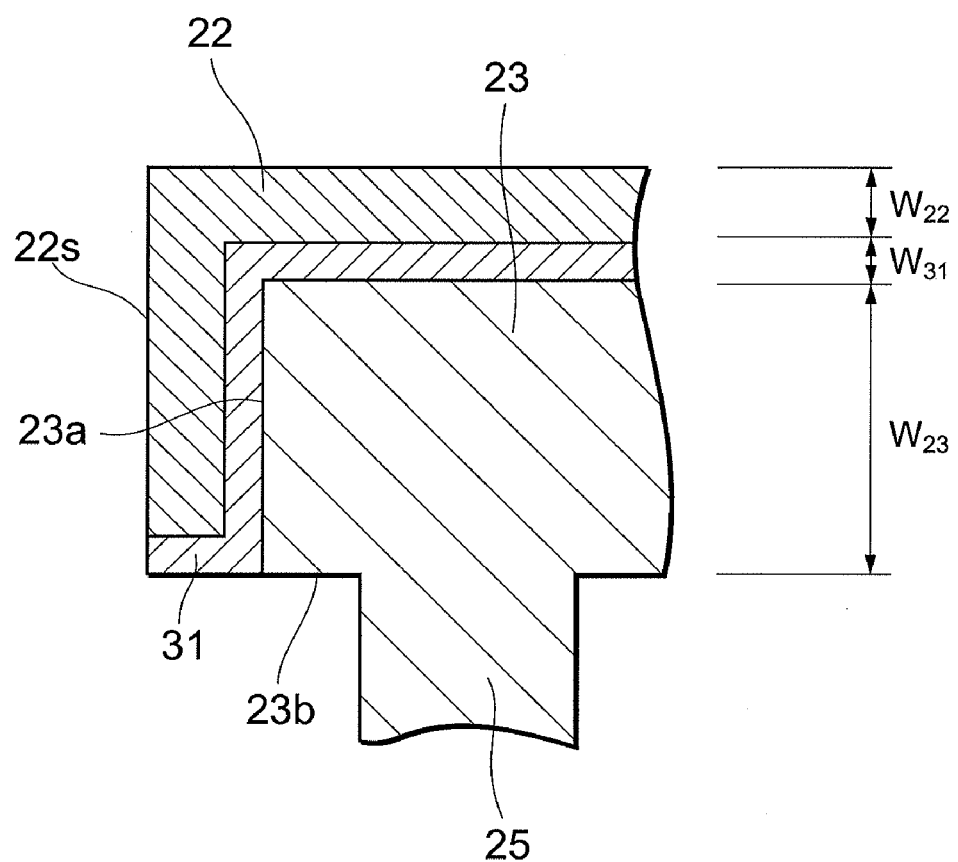
FIG. 19 is an enlarged sectional view illustrating a main part of the reference element depicted in FIG. 6.

The substrate-side insulating film 31 is formed such as to extend over a side face of the heat dissipation film 23 which intersects the surface 10a of the substrate 10, i.e., over a side face 23a of the heat dissipation film 23 which intersects a surface 23b of the heat dissipation film 23 on the substrate 10 side as illustrated in detail in FIG. 19, thereby directly covering the side face 23a. Further, the extension part 22s of the bolometer thin film 22 is formed on the side face 23a. Hence, the bolometer thin film 22 and substrate-side insulating film 31 are formed such as to extend over the side face 23a of the heat dissipation film 23, thereby covering the side face 23a.

The heat dissipation film 23 has a wide crank-shaped form obtained by removing corner portions at two diagonal positions from a rectangle along the slits 22f, 22g. The heat dissipation film 23 is made of amorphous silicon (α-Si).

A plurality of heat dissipation columns 25 are formed between the heat dissipation film 23 and substrate 10. Each heat dissipation column 25 has upper and lower end faces joined to the heat dissipation film 23 and heat dissipation metal film 24, respectively, thereby thermally connecting the heat dissipation film 23 and heat dissipation metal film 24 to each other. Each heat dissipation column 25 is made of amorphous silicon and formed into a mainly circular columnar shape extending in a direction intersecting the surface 10a. The heat dissipation columns 25 are arranged at equal longitudinal and transverse intervals so as to be contained within the heat dissipation film 23. Letting W23 be the thickness of the heat dissipation film 23, W23 is greater than each of the thickness W22 of the bolometer thin film 22 and the thickness W31 of the substrate-side insulating film 31 (W23>W22, W23>W31). The heat dissipation columns 25 and heat dissipation film 23 may be formed integrally with each other.

The heat dissipation metal film 24 is formed in a region of the substrate 10a which opposes the light-receiving part 22a. The heat dissipation metal film 24 has an area greater than the total of cross-sectional areas of the plurality of heat dissipation columns 25 and is thermally connected to the heat dissipation columns 25 and substrate 10. For example, Al, Cu, or W is used for the heat dissipation metal film 24.

Assume that heat is generated in the bolometer thin film 22 having the foregoing structure because of a temperature change caused by an infrared ray incident thereon. Then, the heat is transmitted from the bolometer thin film 22 to the substrate 10 through the substrate-side insulating film 31, heat dissipation film 23, heat dissipation columns 25, and heat dissipation metal film 24. The reference element 21 can transmit the heat generated by the temperature change caused by the infrared ray incident thereon to the substrate 10, thereby diffusing it. Changes in resistivity caused by temperature changes such as environmental changes in the bolometer thin film 22 can be read by the signal processing circuit unit 14 through the leads 22*j*, 22*k*, electrode plugs 28, 29, and ROIC pads 26, 27.

Figure 7:
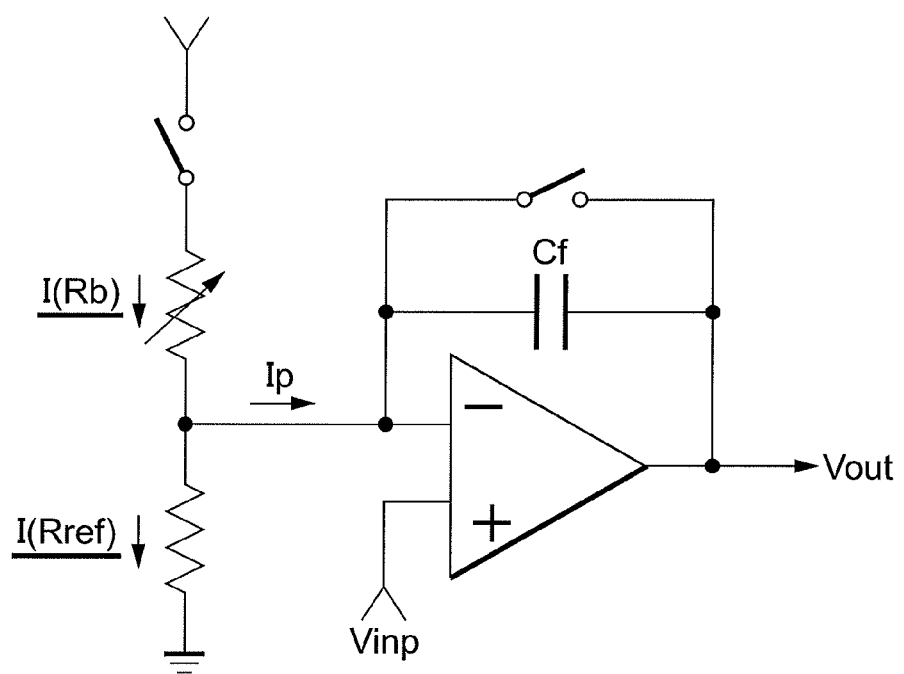
FIG. 7 is a circuit diagram of a signal processing circuit unit illustrated in FIG. 1.
Figure 8:
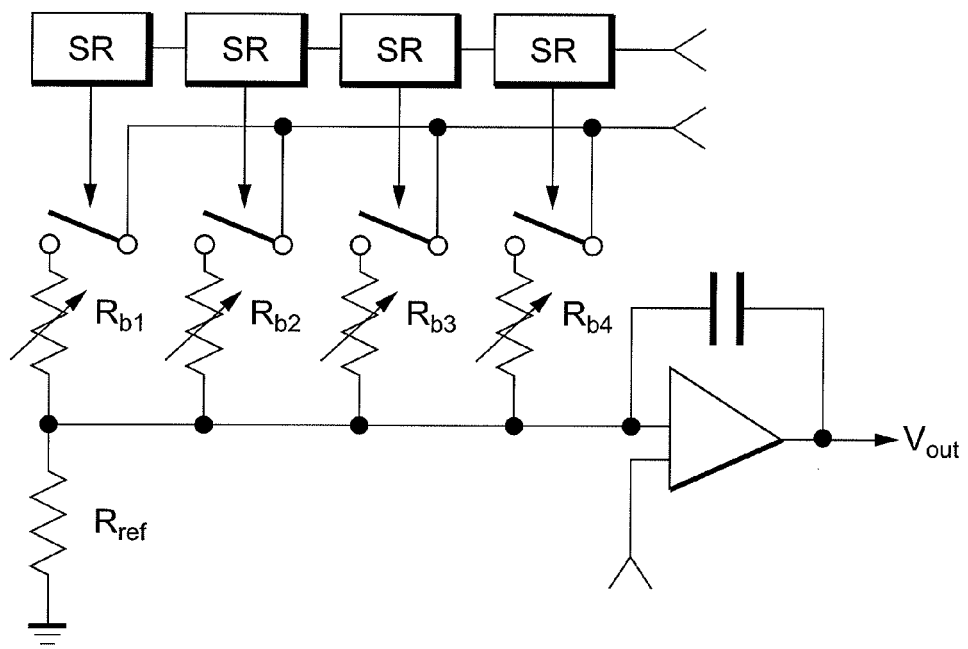
FIG. 8 is a circuit diagram of the signal processing circuit unit illustrated in FIG. 1.
Figure 9:
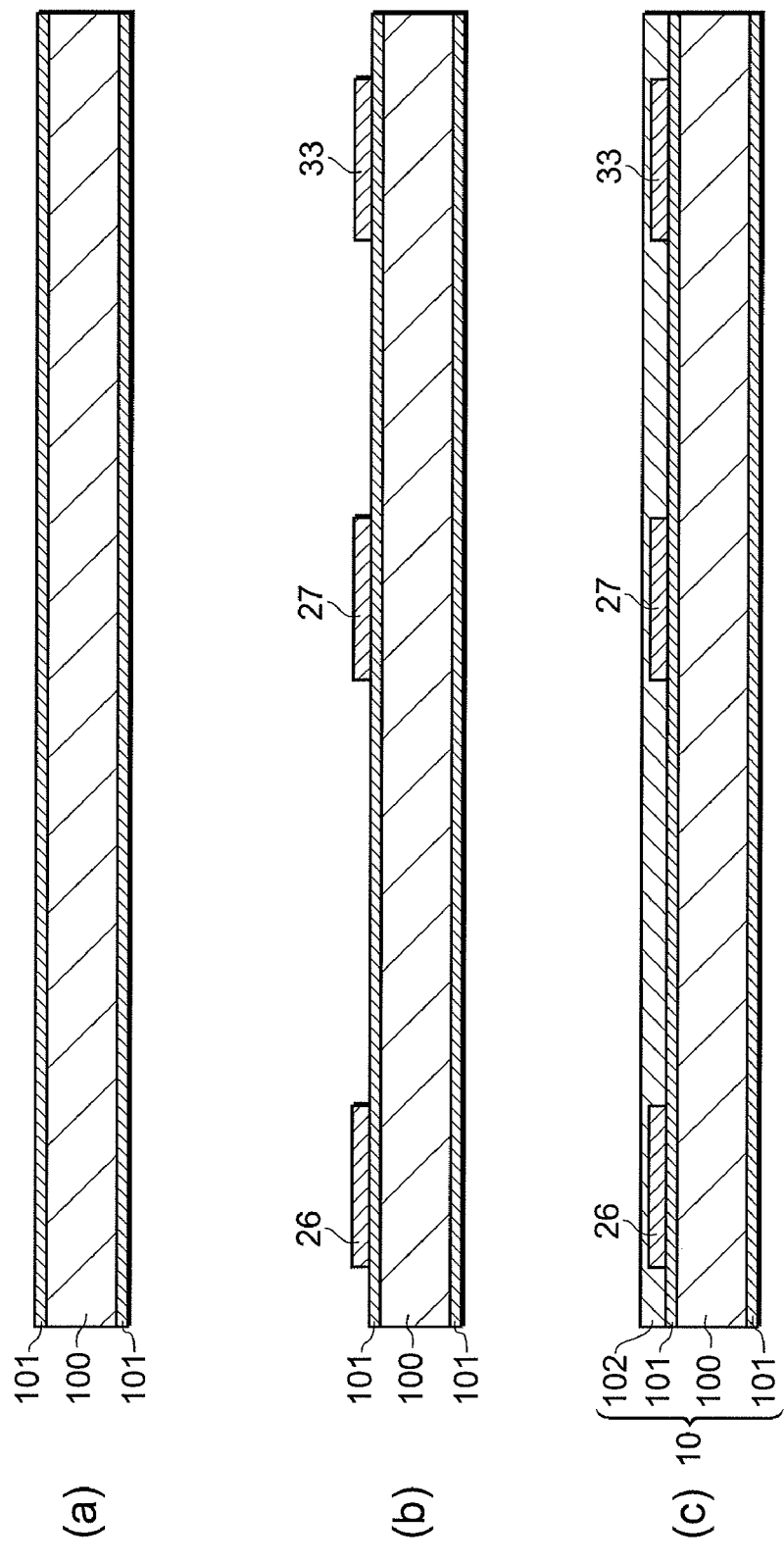
FIG. 9 (a), (b), and (c) are sectional views illustrating a substrate thermal oxidation step, a first electrode formation step, and an $SiO_2$ lamination step in the reference element depicted in FIG. 6, respectively.
Figure 10:
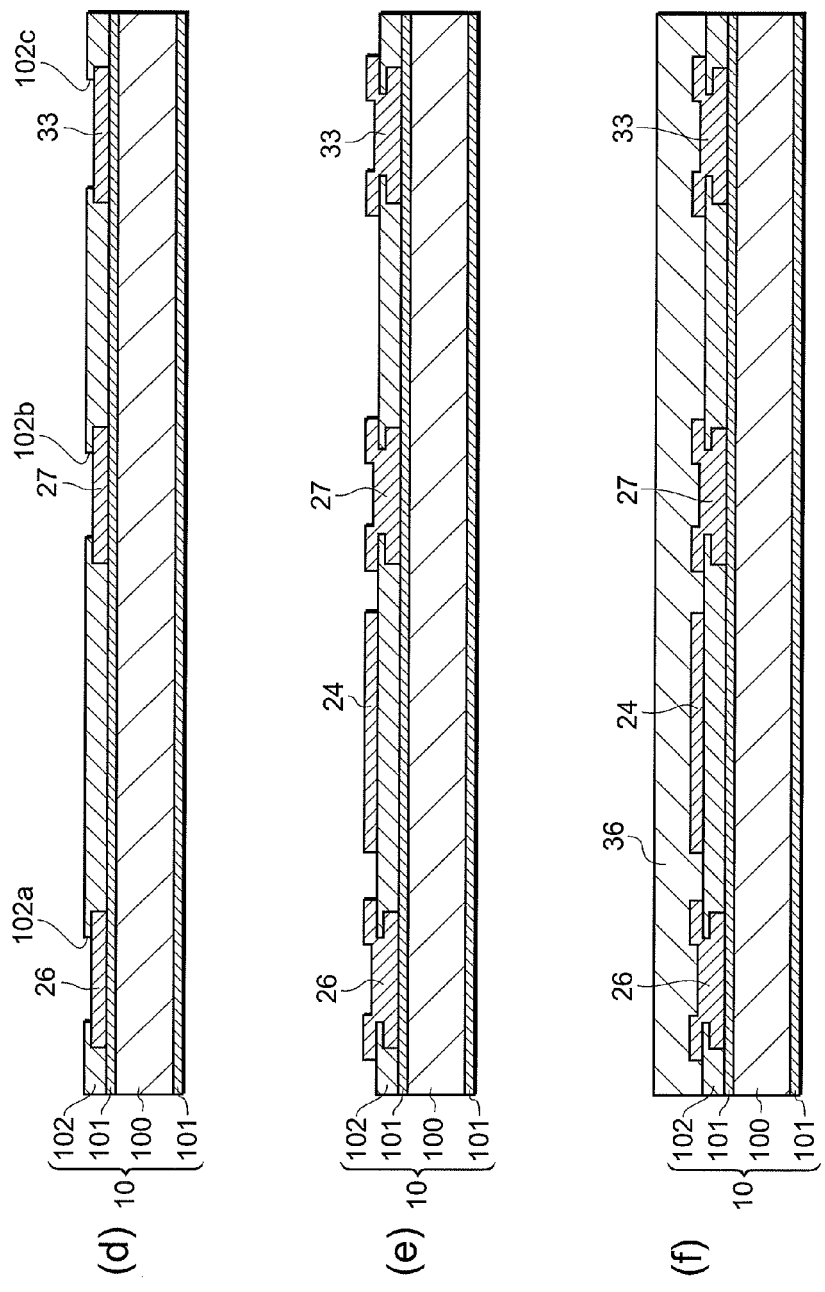
FIG. 10 (d), (e), and (f) are sectional views illustrating steps subsequent to FIG. 9 in sequence.
Figure 11:
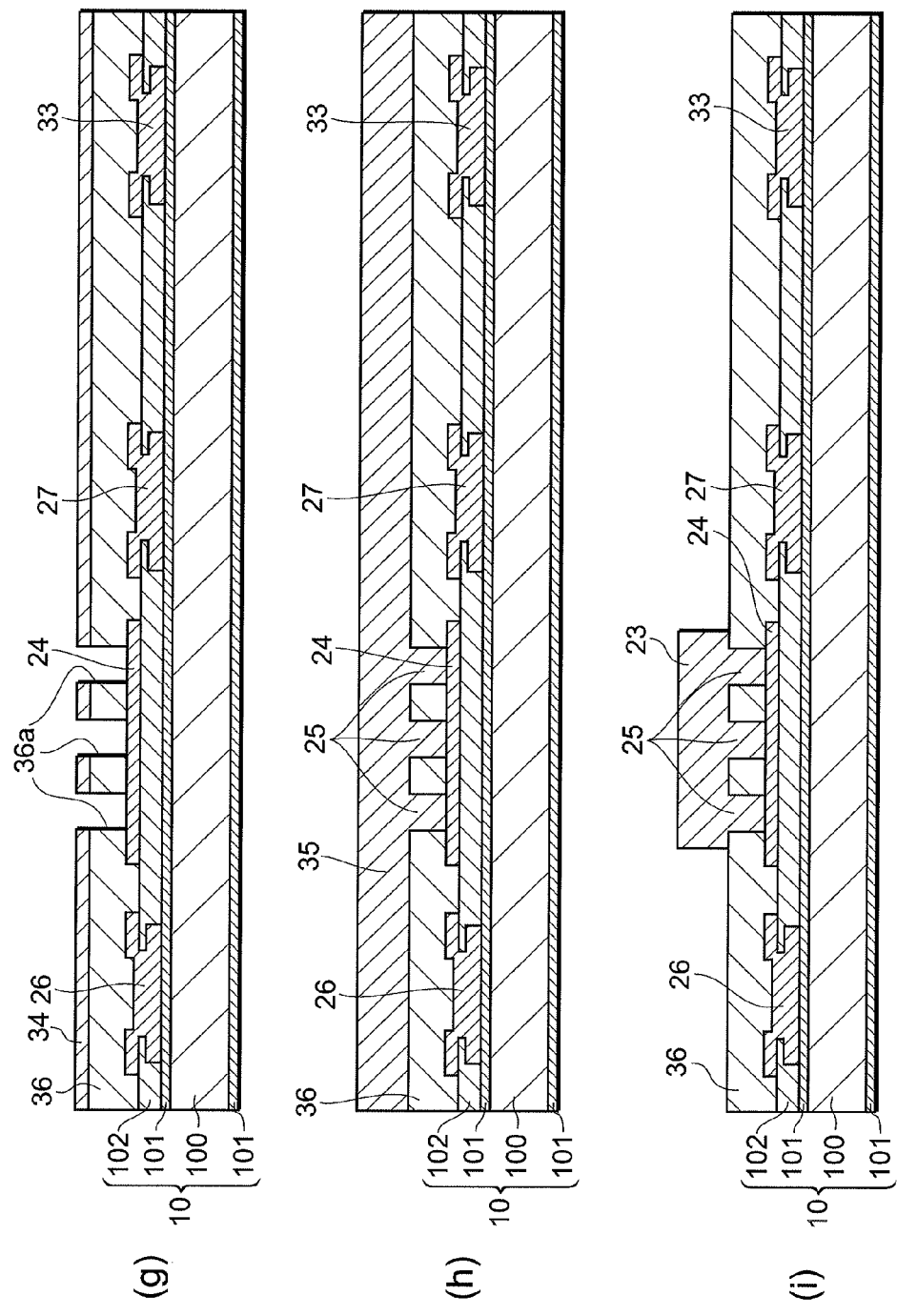
FIG. 11 (g), (h), and (i) are sectional views illustrating steps subsequent to FIG. 10 in sequence.
Figure 12:
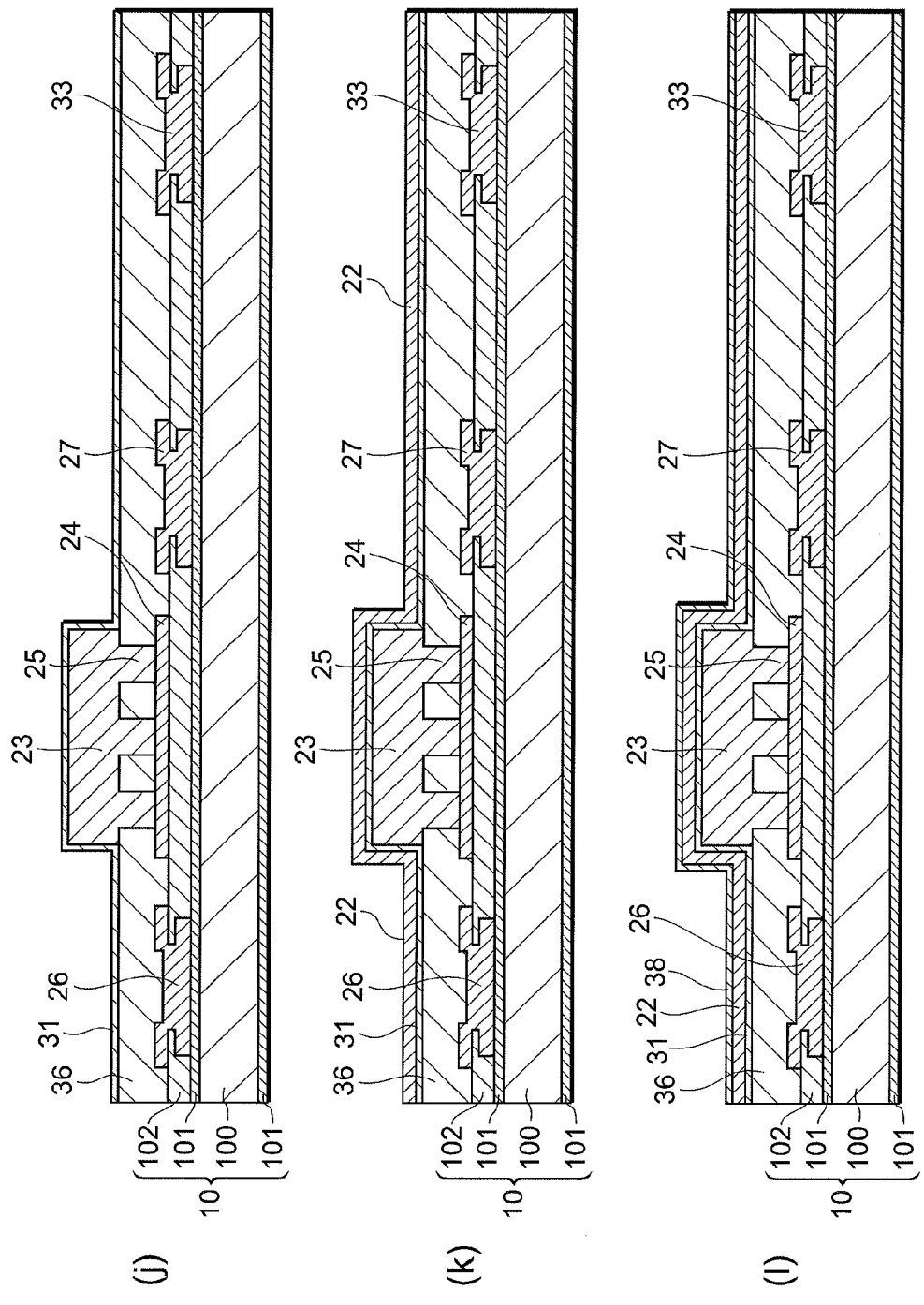
FIG. 12 (j), (k), and (l) are sectional views illustrating steps subsequent to FIG. 11 in sequence.
Figure 13:
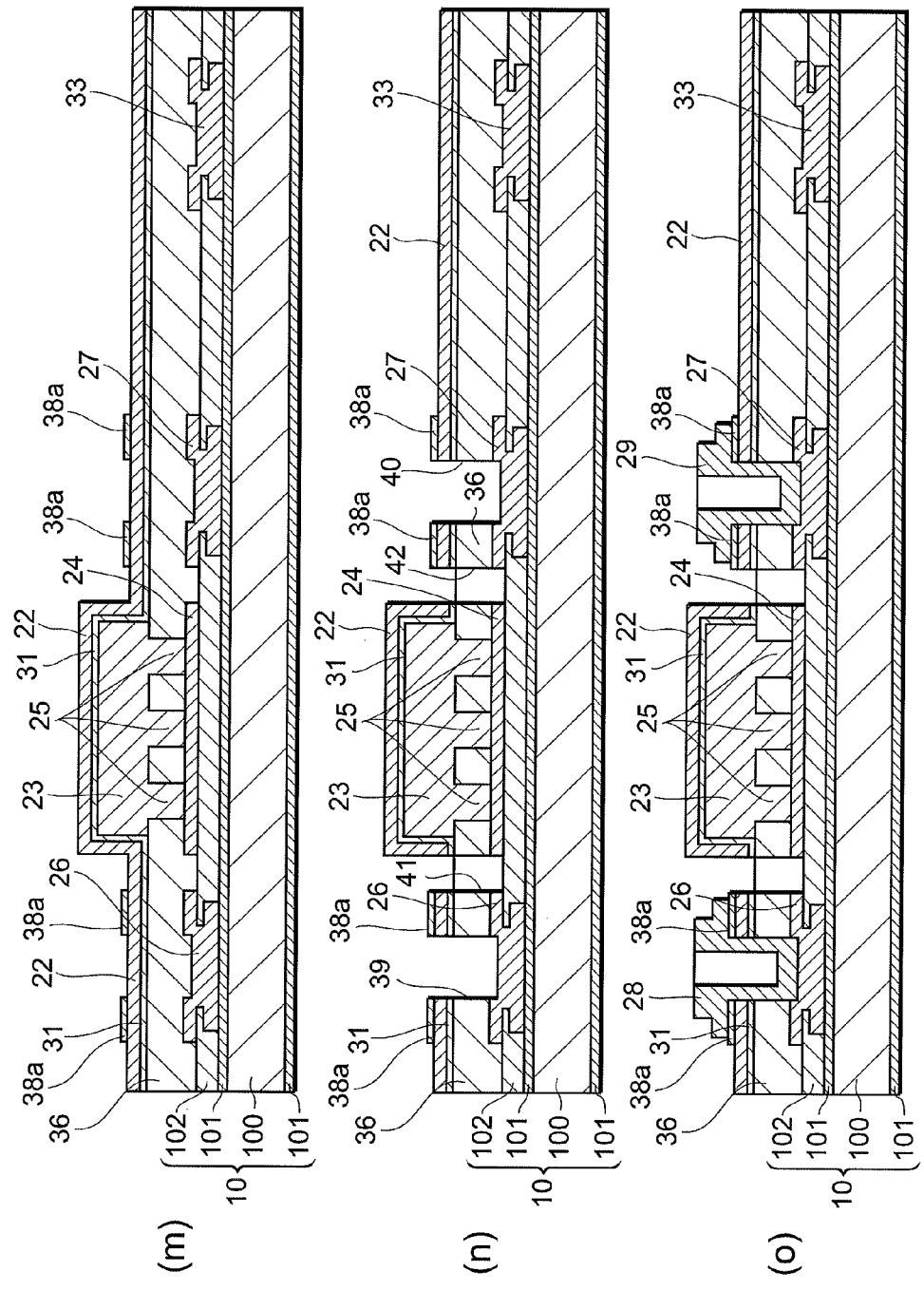
FIG. 13 (m), (n), and (o) are sectional views illustrating steps subsequent to FIG. 12 in sequence.
Figure 14:
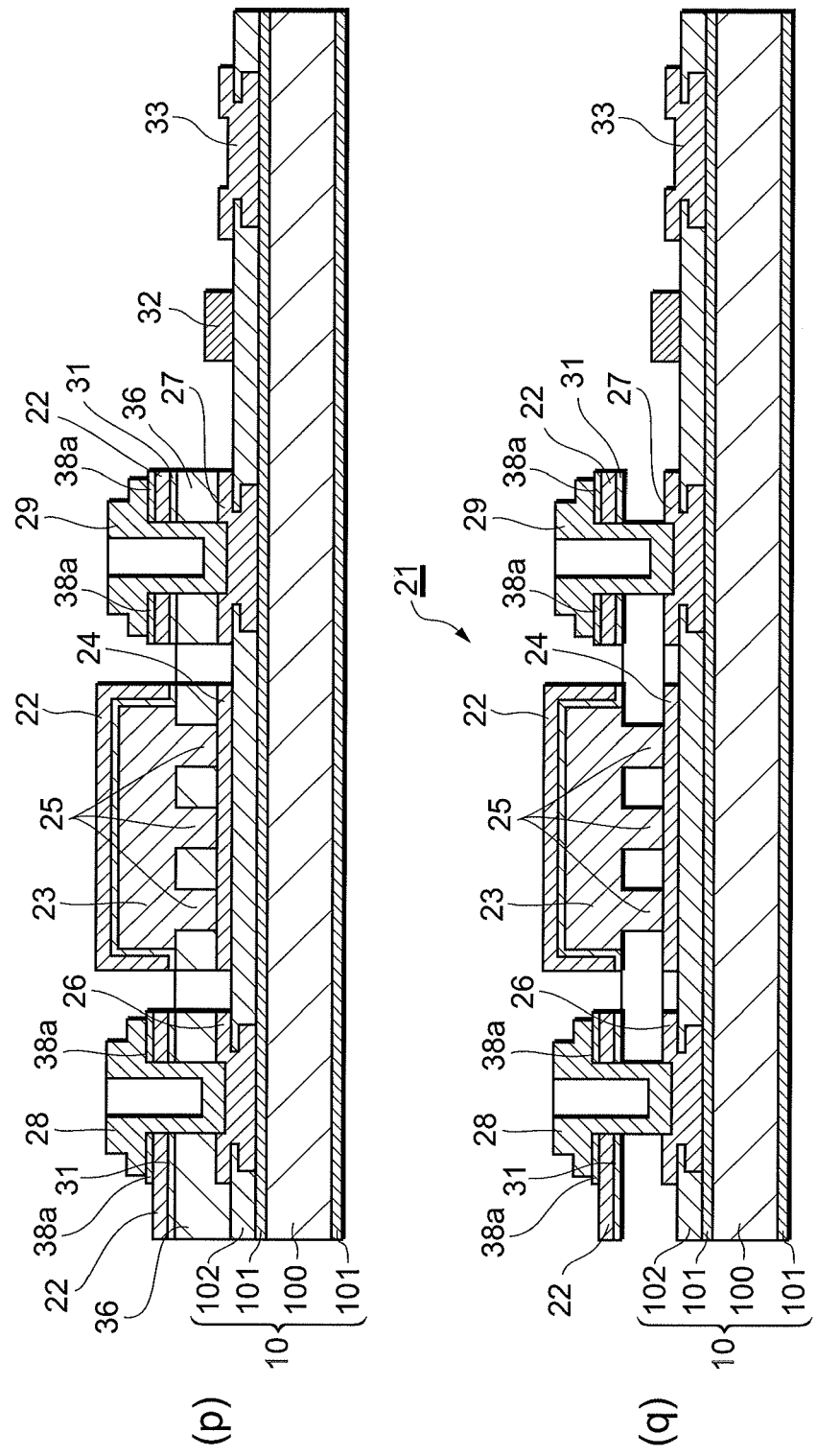
FIG. 14 (p) and (q) are sectional views illustrating steps subsequent to FIG. 13 in sequence.

On the other hand, the signal processing circuit unit 14 illustrated in FIG. 1 is a readout circuit and has functions to read output signals of the pixel unit 12 and reference pixel unit 13 and subtract the output signal of the reference pixel unit 13 from the output signal of the pixel unit 12. The readout circuit will now be explained specifically with reference to FIGS. 7 and 8. FIGS. 7 and 8 are diagrams illustrating circuit configurations of the readout circuit of the signal processing circuit unit 14. First, for easier understanding of the explanation, an infrared sensor of a minimal structure comprising one each of the bolometer element 11 and reference element 21 will be explained by way of example. In this minimal structure, an integration circuit illustrated in FIG. 7, for example, is used for measuring an output voltage Vout. The output voltage Vout is represented by the following expression (1):

$$V_{out} - V_{inp} = -I_p \cdot t / C_f \tag{1}$$

where Ip is the charge amplifier input current obtained by subtracting a reference resistance current I (Rref) flowing through the light-receiving part 22*a* of the reference element 21 from a bolometer current I (Rb) flowing through the light-receiving part 15*a* of the bolometer element 11, and Cf is the integral capacity of a capacitor.

The signal processing circuit unit 14 converts a change in resistance value into a change in the output voltage Vout by using expression (1), and the infrared ray is detected according to the electric signal. An infrared sensor comprising a plurality of bolometer elements 11 and one reference element 21 will now be explained. In this case, the output voltage Vout based on the charge amplifier input current Ip corresponding to each bolometer current I (Rbn) (n is an integer) is measured by using a shift register SR as illustrated in FIG. 8, for example. Then, the infrared ray is detected according to the electric signal.

Operations of the infrared sensor 1 having the foregoing structure will now be explained. When an infrared ray is incident on the infrared sensor 1, the infrared ray is absorbed by the light-receiving part 15*a* of the bolometer element 11. The light-receiving part 15*a* generates heat in response to the infrared ray absorbed thereby. Since the light-receiving part 15*a* is thermally separated from its surrounding members such as the substrate 10 by the void 11*a*, the heat generated by the light-receiving part 15*a* raises the temperature of the light-receiving part 15*a* without diffusing into its surroundings. This temperature rise changes the resistance value of the light-receiving part 15*a*. The change in resistance value is sent as a signal to the signal processing circuit unit 14 through the leads 15*j*, 15*k*, electrode plugs 18, 19, and ROIC pads 16, 17 electrically connected to the light-receiving part 15*a*.

If a part of the infrared ray incident on the bolometer thin film 15 is transmitted through the light-receiving part 15*a* without being absorbed thereby, it will be reflected by the reflective film 20, so as to impinge on the light-receiving part 15*a* again. The light-receiving part 15*a* absorbs the re-entering infrared ray as well, thereby generating heat corresponding thereto. Therefore, the infrared sensor 1 can efficiently absorb infrared rays.

On the other hand, when the infrared ray is incident on the infrared sensor 1, it impinges on the reference element 21 as with the bolometer element 11. Then, the infrared ray is absorbed by the light-receiving part 22*a* of the reference element 21. The light-receiving part 22*a* generates heat in response to the absorbed infrared ray. The light-receiving part 22*a* is thermally connected to the heat dissipation film 23, heat dissipation columns 25, heat dissipation metal film 24, and substrate 10 through the substrate-side insulating film 31. Therefore, the heat generated in the light-receiving part 22*a* by the infrared ray incident thereon is transmitted to the substrate-side insulating film 31, heat dissipation film 23, heat dissipation columns 25, and heat dissipation metal film 24 in sequence, so as to propagate to the substrate 10. Since the heat generated by the light-receiving part 22*a* is thus released, only the heat produced by the temperature change caused by the environmental change of the infrared sensor 1 changes the resistance value of the light-receiving part 22*a*. Such a change in resistance value caused by an environmental change is sent as a signal to the signal processing circuit unit 14 through the leads 22*j*, 22*k*, electrode plugs 28, 29, and ROIC pads 26, 27 electrically connected to the light-receiving part 22*a*.

In the signal processing circuit unit 14, the change in resistance value of the light-receiving parts 15*a*, 22*a* is converted into a voltage change, and the infrared ray is detected according to the electric signal.

Thus, in the infrared sensor 1, the bolometer thin film 22 in the reference element 21 is connected to the substrate 10 through the substrate-side insulating film 31, heat dissipation film 23, and heat dissipation columns 25. Therefore, the heat generated in the light-receiving part 22*a* by the infrared ray is efficiently dissipated by being transmitted to the substrate 10 through the substrate-side insulating film 31, heat dissipation film 23, plurality of heat dissipation columns 25, and heat dissipation metal film 24, whereby temperature changes generated by changes in the environment in use can be measured alone accurately.

In addition, as mentioned above, the bolometer thin film 22 and substrate-side insulating film 31 are formed such as to extend over and come into contact with the side face 23*a* of the heat dissipation film 23. This increases the contact area with the dissipation film 23 as compared with the case where only the flat part along the substrate 10 is in contact therewith. Therefore, a path through which heat is transmitted from the bolometer thin film 22 to the heat dissipation film 23 expands, whereby the heat generated in the light-receiving part 22*a* is more efficiently transmitted to the heat dissipation film 23. Hence, the heat is dissipated very efficiently. As a result, the infrared sensor 1 can reduce the influence of temperature changes in the environment in use more efficiently. Since the bolometer thin film 22 and substrate-side insulating film 31 are formed such as to extend over the side face 23*a* of the heat dissipation film 23, the bolometer thin film 22 and substrate-side insulating film 31 and the heat dissipation film 23 are harder to peel off from each other, while the bolometer thin film 22 and heat dissipation film 23 are reliably insulated from each other.

In the reference element 21, since the heat dissipation metal film 24 is interposed between the heat dissipation columns 25 and substrate 10, a greater thermal contact area is formed between the heat dissipation columns 25 and substrate 10. Therefore, the heat generated in the bolometer thin film 22 by the infrared ray incident thereon is transmitted to the substrate 10 more efficiently, whereby more efficient heat dissipation is performed.

In the reference element 21, the light-receiving part 22*a* and substrate 10 are thermally connected to each other through a plurality of heat dissipation columns 25 having a columnar structure. This can keep stresses from being exerted on the bolometer thin film 15 by a difference in coefficient of thermal expansion between the light-receiving part 22*a* and heat dissipation columns 25 or between the substrate 10 and heat dissipation columns 25 as compared with a case where the light-receiving part 22a and substrate 10 are constructed by a single mass. Hence, cracks can be prevented from occurring in the bolometer thin film 15.

When the heat dissipation columns 25 and heat dissipation film 23 are formed integrally in the reference element 21, stresses generated by differences in coefficient of thermal expansion between the substrate 10 and heat transfer bodies can be dispersed. As a result, cracks can be prevented from occurring in the bolometer thin film 15.

Since the reference element 21 has a form similar to that of the bolometer element 11, the difference in resistance caused by the difference in form between the elements can be reduced. Therefore, the reference element 21 can favorably be employed as a reference element.

The heat dissipation film 23 and heat dissipation columns 25, which are made of amorphous silicon, are each preferably doped with a metal element. This is because the doping with a metal element yields a better heat transfer efficiency, thereby ameliorating the heat dissipation characteristic.

A method of manufacturing the infrared sensor 1 in accordance with the embodiment of the present invention will now be explained. In the following, a process of manufacturing the reference element 21 will mainly be explained, since it includes a process of manufacturing the bolometer element 11. FIGS. 9 to 14 are sectional views illustrating structures of the reference element 21 being manufactured in the infrared sensor 1 depicted in FIG. 1.

First, as illustrated in FIG. 9(a), a substrate thermal oxidation step is carried out. This step oxidizes a surface of an Si substrate 100, so as to form a thermally oxidized film 101 on the Si substrate 100. The thickness of the thermally oxidized film 101 is 0.7 μm, for example.

Subsequently, as illustrated in FIG. 9(b), a first electrode formation step is carried out. This step forms ROIC pads 26, 27 of the reference element 21 and an electrode pad 33 on the thermally oxidized film 101. For example, Al—Si—Ti is laminated by a thickness of about 1 μm, an undepicted mask using a photoresist is formed thereon, and then unnecessary parts are etched away, so as to yield the ROIC pads 26, 27 and electrode pad 33. Though dry etching is preferred for homogeneous formation, wet etching may also be used for the etching.

Then, as illustrated in FIG. 9(c), an $SiO_2$ lamination step is carried out. This step laminates an $SiO_2$ film 102 on the thermally oxidized film 101, ROIC pads 26, 27, and electrode pad 33. For example, the $SiO_2$ film 102 is laminated by a thickness of about 1 μm by plasma CVD. Here, the Si substrate 100, thermally oxidized film 101, and $SiO_2$ film 102 constitute the substrate 10.

Next, as illustrated in FIG. 10(d), an opening formation step is carried out. This step forms openings 102a, 102b, 102c in the $SiO_2$ film 102 at respective positions on the ROIC pads 26, 27 and electrode pad 33. For example, a mask using a photoresist is formed on the $SiO_2$ film 102, and then unnecessary parts of the $SiO_2$ film 102 are etched away, so as to yield the openings 102a, 102b, 102c.

Subsequently, as illustrated in FIG. 10(e), a second electrode formation step is carried out. This step forms a metal layer made of the same material as with the ROIC pads 26, 27 and electrode pad 33, then produces a mask using a photoresist, and thereafter etches unnecessary parts away, so as to yield ROIC pads 26, 27, an electrode pad 33, and a heat dissipation metal film 24. Here, the ROIC pads 26, 27 and electrode pad 33 formed by the first electrode formation step are integrated with the ROIC pads 26, 27 and electrode pad 33 formed by the second electrode formation step, respectively, and the upper faces of the ROIC pads 26, 27 and electrode pad 33 are positioned above the $SiO_2$ film 102 through the openings 102a, 102b, 102c, respectively. Further, the upper faces of the ROIC pads 26, 27, electrode pad 33, and heat dissipation metal film 24 are positioned on the same plane. Thus positioning the upper faces of the ROIC pads 26, 27, electrode pad 33, and heat dissipation metal film 24 on the same plane flattens the membrane structure of the reference element 21.

Then, as illustrated in FIG. 10(f), a sacrificial layer formation step is carried out. This step forms a sacrificial layer 36 by applying polyimide by a thickness of about 2.5 μm to the surface of the multilayer body, for example.

Next, as illustrated in FIG. 11(g), a dummy pixel preparation step is carried out. This step initially laminates a protective layer 34 on the surface of the multilayer body as preprocessing for forming the opening. For example, amorphous silicon is laminated, so as to form the protective layer 34 on the surface of the multilayer body. TEOS—$SiO_2$ (an $SiO_2$ film formed by a plasma CVD system using TEOS) may be laminated, so as to form the protective layer 34. The protective layer 34 is laminated by a thickness of about 50 nm, for example.

Subsequently, an undepicted mask using a photoresist is formed, and then unnecessary parts are etched away, so as to yield a plurality of openings 36a penetrating through the protective layer 34 and sacrificial layer 36. In this case, the openings 36a are formed such that their inner diameters are as small as possible, whereby the openings 36a have an inner diameter of about 2 μm each with a pitch of 2 to 5 μm therebetween, for example.

After forming the openings 36a, the protective layer 34 is removed. For example, $XeF_2$ is used when amorphous silicon is employed as the protective layer 34. HF is used when TEOS—$SiO_2$ is employed as the protective layer 34.

Then, as illustrated in FIG. 11(h), a heat dissipation column formation step is carried out. This step forms an amorphous silicon film 35, which will later become heat dissipation columns 25 and a heat dissipation film 23, over the upper face of the sacrificial layer 36 including the inside of the openings 36a produced by the dummy pixel preparation step. In this case, for example, amorphous silicon is laminated by a thickness of about 1 μm by sputtering, so as to form the amorphous silicon film 35. This forms the heat dissipation columns 25 within the openings 36a. The heat dissipation columns 25 have an inner diameter of about 2 μm each with a pitch of 2 to 5 μm therebetween, for example.

Figure 15:
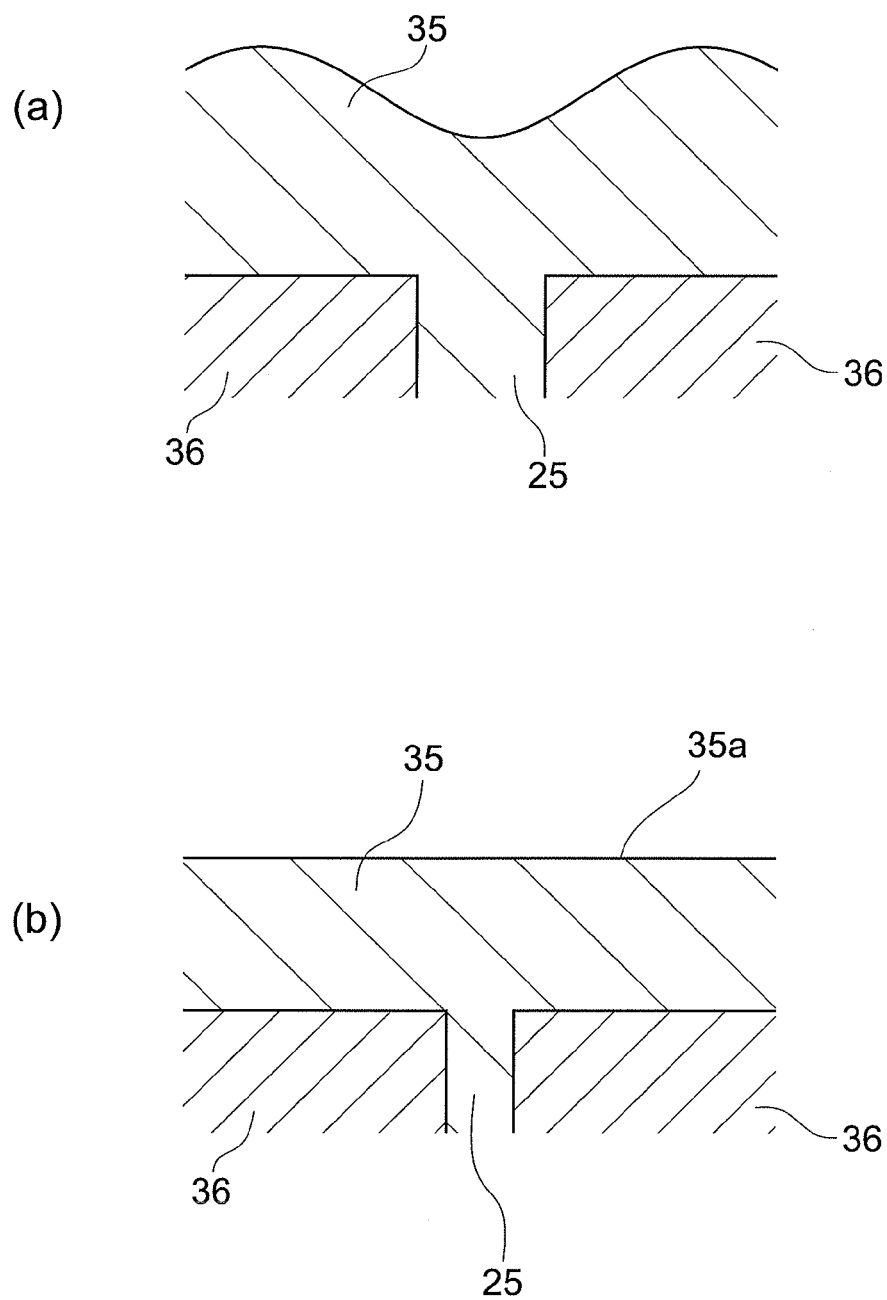
FIG. 15 is a schematic view explaining effects of heat dissipation columns illustrated in FIG. 11.

Here, the inner diameter of the openings 36a is made as small as possible in the above-mentioned dummy pixel preparation step. Therefore, for example, a surface 35a of the amorphous silicon film 35 joined to the heat dissipation columns 25 can be made flatter as illustrated in FIG. 15(b) than in the case where the outer diameter of the heat dissipation columns 25 (i.e., the inner diameter of the openings 36a) is larger as illustrated in FIG. 15(a). This makes it unnecessary to perform a flattening step (etch-back step) separately for flattening the membrane structure after the heat dissipation column formation step and thus can cut down the manufacturing cost and shorten the manufacturing time. Further, forming the heat dissipation columns 25 with a smaller diameter saves the amount of silicon used and thus can cut down the material cost as well.

Next, as illustrated in FIG. 11(i), a heat dissipation film formation step is carried out. This step forms an undepicted mask using a photoresist and then etches the amorphous silicon film 35, so as to yield a heat dissipation film 23 on the heat dissipation columns 25. Thus, this embodiment forms the heat dissipation columns 25 and heat dissipation film 23 integrally with each other and thus can disperse stresses generated by the difference in coefficient of thermal conductivity between the substrate 10 and heat dissipation columns 25, whereby cracks can be prevented from occurring in the bolometer thin film 15.

Subsequently, as illustrated in FIG. 12(j), an insulating film lamination step is carried out. This step laminates TEOS—$SiO_2$ by a thickness of about 100 nm on the whole surface of the multilayer body, for example, so as to form a substrate-side insulating film 31. Then, as illustrated in FIG. 12(k), a bolometer thin film lamination step is performed. This step laminates amorphous silicon by a thickness of about 100 nm on the whole surface of the multilayer body, for example, so as to form a bolometer thin film 22. The insulating film lamination step and bolometer thin film lamination step form the substrate-side insulating film 31 in direct contact with the upper surface of the heat dissipation film 23 and its side faces intersecting the upper surface, and further produce the bolometer thin film 22 on the upper surface of the heat dissipation film 23 and its side faces intersecting the upper surface while interposing the substrate-side insulating film 31 therebetween.

Then, as illustrated in FIG. 12(l), an electrode metal film lamination step is carried out. This step laminates an electrode metal film 38 on the whole surface of the multilayer body. For example, WSi or Ti is laminated by a thickness of about 50 nm, so as to form the electrode metal film 38. The electrode metal film 38 may be laminated by a thickness of about 100 nm as well.

Next, as illustrated in FIG. 13(m), an upper electrode formation step is carried out. This step produces an undepicted resist pattern using a photoresist and etches away unnecessary parts of the electrode metal film 38, thereby forming upper electrodes 38a.

Subsequently, as illustrated in FIG. 13(n), an opening formation step is carried out. This step forms openings 39, 40 in the layers on the ROIC pads 26, 27, respectively, and openings 41, 42 in the layers positioned between the metal film 24 and the ROIC pads 26, 27 on the substrate 10, respectively.

Thereafter, as illustrated in FIG. 13(o), an electrode plug formation step is carried out. This step laminates a metal film by sputtering or vacuum deposition and then forms electrode plugs 28, 29 in the openings 39, 40, respectively, by liftoff. For example, the electrode plugs 28, 29 are formed by Al. This integrates the upper electrodes 38a with their corresponding electrode plugs 28, 29.

Next, as illustrated in FIG. 14(p), a lower electrode formation step is carried out. This step removes the layers on the electrode pad 33, forms an electrode metal film (using Ti, Pt, Au, or Sn, for example) thereafter, makes an undepicted resist pattern using a photoresist, and performs liftoff, so as to yield a lower electrode 32. The lower electrode 32 includes leads for connecting the ROIC pads 26, 27 to the signal processing circuit 14, for example. Thereafter, as illustrated in FIG. 14(q), a sacrificial layer removal step is carried out. This step ashes the sacrificial layer 36 made of polyimide with $O_2$, for example. Thus completely removing the sacrificial layer 36 can prevent unnecessary gases from being generated from the sacrificial layer 36 upon heat treatment and the like in the process.

Performing the steps illustrated in FIGS. 9 to 14 as in the foregoing can manufacture the reference element 21 that can favorably diffuse the heat caused by infrared absorption into the substrate 10. For making the bolometer element 11, the steps illustrated in FIGS. 11 and 12 such as the dummy pixel preparation step, heat dissipation column formation step, and heat dissipation film formation step are unnecessary.

The bolometer element 11 and reference element 21 can be made on the same substrate 10 at the same time. In this case, the bolometer thin films 15, 22 are positioned on substantially the same plane substantially parallel to the surface of the substrate 10, which makes it easier to control the focal depth upon patterning by exposure to light, whereby the infrared sensor 1 can be made smaller. Further, when thus manufactured, the pixel unit 12 and reference pixel unit 13 increase their uniformity in resistivity, whereby functions as a reference element can be improved.

Further, the signal processing circuit unit 14, which is not depicted but manufactured independently, is connected to the pixel unit 12 constituted by the bolometer element 11 and the reference pixel unit 13 constituted by the reference element 21, whereby the infrared sensor 1 is completed.

The above-mentioned embodiment illustrates an example of the infrared sensor in accordance with the present invention. The infrared sensor in accordance with the present invention is not limited to the one in accordance with the embodiment but may be one modifying the infrared sensor in accordance with the embodiment or employing it for others.

Figure 16:
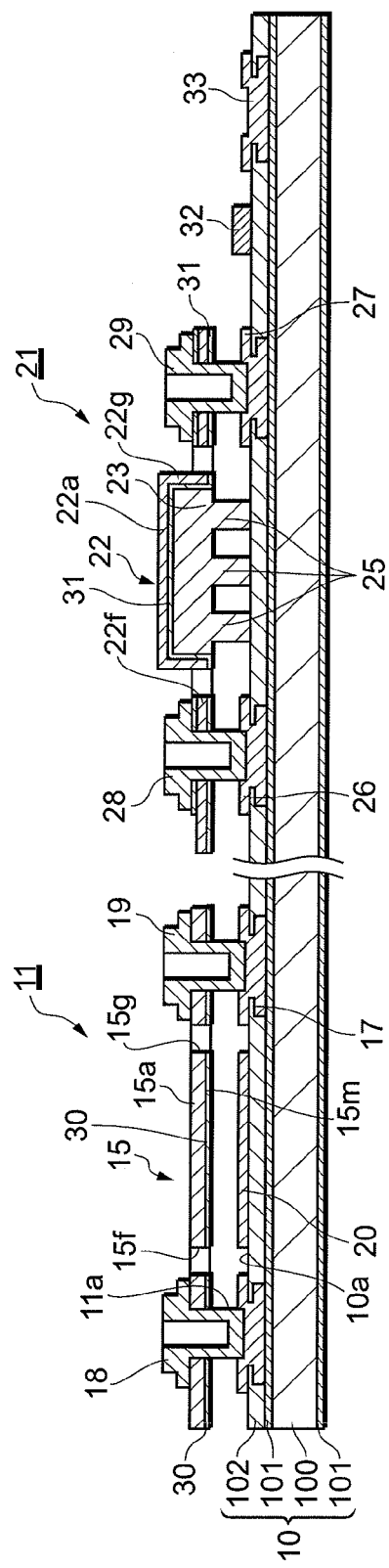
FIG. 16 is a modified example of the infrared sensor illustrated in FIG. 1.

For example, though the above-mentioned embodiment explains the infrared sensor 1 equipped with the reference element 21 having the heat dissipation metal film 24, the reference element 21 may be free of the heat dissipation metal film 24 as illustrated in FIG. 16. In such a structure, the heat generated by an infrared ray in the light-receiving part 22a is transmitted to the substrate-side insulating film 31, heat dissipation film 23, and heat dissipation columns 25 in sequence, so as to propagate to the substrate 10. Therefore, as in the above-mentioned embodiment, the reference element 21 can accurately detect temperature changes caused by environmental changes and the like, thus making it possible to efficiently reduce the influence of temperature changes in the environment in use, while being made smaller.

Figure 17:
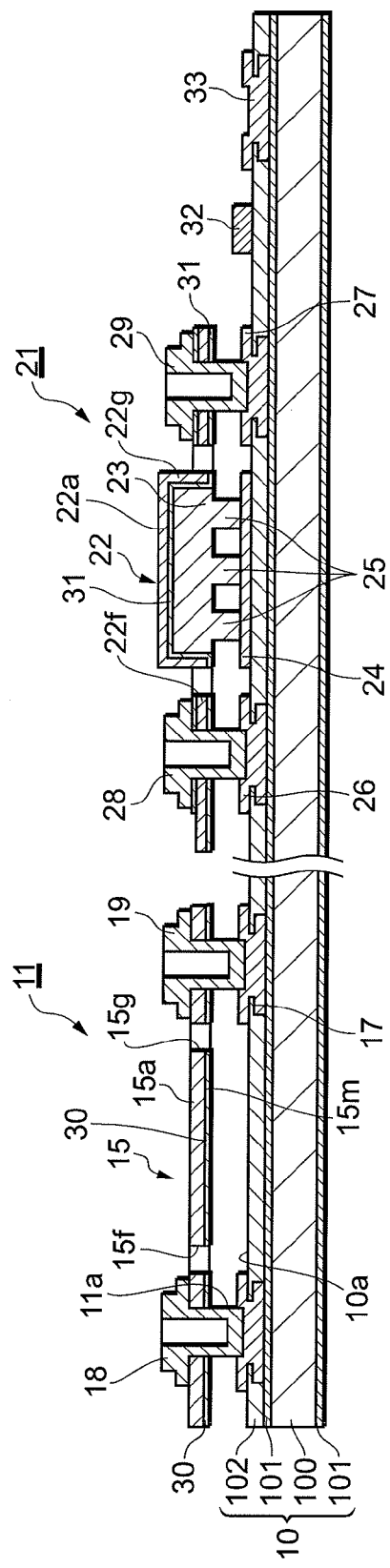
FIG. 17 is a modified example of the infrared sensor illustrated in FIG. 1.

Though the above-mentioned embodiment explains the infrared sensor 1 equipped with the bolometer element 11 having the reflective film 20, the bolometer element 11 may be free of the reflective film 20 as illustrated in FIG. 17. Even in this case, the heat generated by the infrared ray in the light-receiving part 22a of the reference element 21 is transmitted to the substrate-side insulating film 31, heat dissipation film 23, heat dissipation columns 25, and heat dissipation metal film 24 in sequence, so as to propagate to the substrate 10. Therefore, as in the above-mentioned embodiment, the reference element 21 can accurately detect temperature changes caused by environmental changes and the like, thus making it possible to efficiently reduce the influence of temperature changes in the environment in use, while being made smaller.

Figure 18:
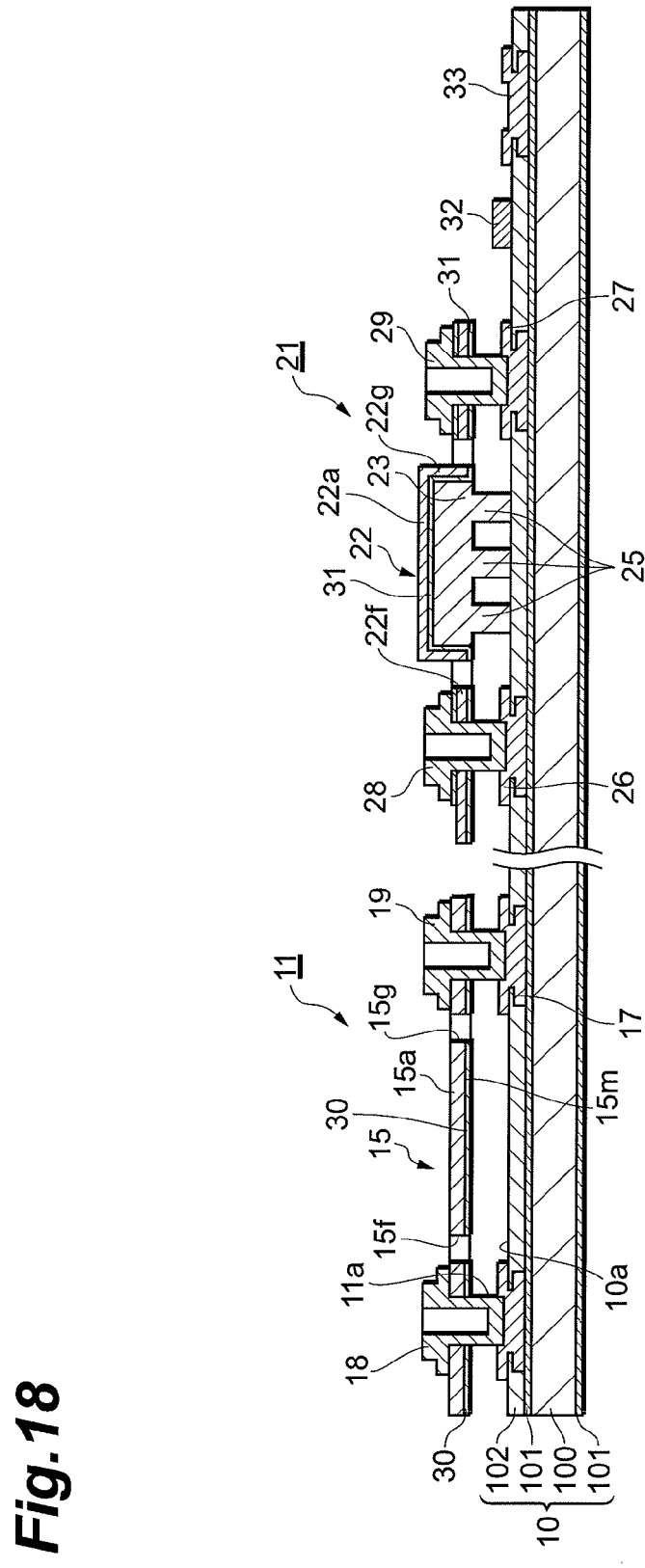
FIG. 18 is a modified example of the infrared sensor illustrated in FIG. 1.

Though the above-mentioned embodiment explains the infrared sensor 1 equipped with the reference element 21 having the heat dissipation metal film 24 and the bolometer element 11 having the reflective film 20, the reference element 21 and bolometer element 11 may be free of the heat dissipation metal film 24 and reflective film 20, respectively, as illustrated in FIG. 18. Even in this case, the heat generated by the infrared ray in the light-receiving part 22a of the reference element 21 is transmitted to the substrate-side insulating film 31, heat dissipation film 23, and heat dissipation columns 25 in sequence, so as to dissipate into the substrate 10. Therefore, as in the above-mentioned embodiment, the reference element 21 can accurately detect temperature changes caused by environmental changes and the like, thus making it possible to efficiently reduce the influence of temperature changes in the environment in use, while being made smaller.

Though the above-mentioned embodiment explains a case where the heat dissipation columns 25 are formed substantially circular columnar, the heat dissipation columns 25 may have a columnar shape with a rectangular or triangular cross section as well. Even in such a case, the size reduction can be achieved while efficiently lowering the influence of temperature changes in the environment in use.

INDUSTRIAL APPLICABILITY

The present invention can make an optical sensor smaller while efficiently reducing the influence of temperature changes in the environment in use.

REFERENCE SIGNS LIST

1 . . . infrared sensor (optical sensor); 10 . . . substrate; 15 . . . bolometer thin film; 22 . . . bolometer thin film; 20 . . . reflective film; 23 . . . heat dissipation film; 24 . . . heat dissipation metal film; 25 . . . heat dissipation column; 31 . . . substrate-side insulating film

The invention claimed is:

1. An optical sensor comprising:
   a first bolometer film supported on a surface of a substrate while being separated from the surface of the substrate;
   a second bolometer film supported on the surface of the substrate while being separated from the surface of the substrate;
   a substrate-side insulating film formed on a substrate-side surface of the second bolometer film;
   a heat dissipation film made of amorphous silicon formed on the substrate-side surface of the second bolometer film with the substrate-side insulating film interposed therebetween; and
   a plurality of heat dissipation columns made of amorphous silicon thermally connected to the heat dissipation film and substrate;
   wherein the second bolometer film and substrate-side insulating film are formed such as to extend over a side face of the heat dissipation film intersecting the surface of the substrate.

2. An optical sensor according to claim 1, wherein a metal film is formed in a region opposing the second bolometer film in the surface of the substrate; and
   wherein the plurality of heat dissipation columns are thermally connected to the substrate through the metal film.

3. An optical sensor according to claim 1, wherein a reflective film made of a metal is formed in a region opposing the first bolometer film in the surface of the substrate.

4. An optical sensor according to claim 1, wherein the first and second bolometer films are arranged substantially parallel to the surface of the substrate and formed at substantially the same height from the substrate.

5. An optical sensor according to claim 1, wherein the amorphous silicon constituting the heat dissipation film and the plurality of heat dissipation columns is doped with a metal element.

6. An optical sensor according to claim 1, wherein the substrate-side insulating film is formed by an insulating material containing silicon.

* * * * *